(12) United States Patent
Rathi et al.

(10) Patent No.: US 10,138,592 B2
(45) Date of Patent: Nov. 27, 2018

(54) OPEN MESH SCREEN

(71) Applicant: SAINT-GOBAIN ADFORS CANADA, LTD., Grand Island, NY (US)

(72) Inventors: Sahas Rathi, Westborough, MA (US); Jia-Mei Soon, L'hay les Roses (FR); Jackson A. Ivey, Worcester, MA (US); Nancy E. Brown, New Braintree, MA (US); Pascal Nael, Aubervilliers (FR)

(73) Assignee: SAINT-GOBAIN ADFORS CANADA, LTD., Grand Island, NY (US)

( * ) Notice: Subject to any disclaimer, the term of this patent is extended or adjusted under 35 U.S.C. 154(b) by 1 day.

(21) Appl. No.: 15/293,509

(22) Filed: Oct. 14, 2016

(65) Prior Publication Data

US 2017/0107661 A1    Apr. 20, 2017

Related U.S. Application Data

(60) Provisional application No. 62/241,442, filed on Oct. 14, 2015.

(51) Int. Cl.
*D06M 11/84* (2006.01)
*D06M 11/83* (2006.01)
(Continued)

(52) U.S. Cl.
CPC .............. *D06M 11/83* (2013.01); *C03C 25/10* (2013.01); *C23C 14/20* (2013.01); *G02B 5/0215* (2013.01);
(Continued)

(58) Field of Classification Search
CPC ....................................................... D06M 11/84
(Continued)

(56) References Cited

U.S. PATENT DOCUMENTS 4,587,997 A    5/1986  Brooks
6,875,479 B2   4/2005  Jung et al.
(Continued)

FOREIGN PATENT DOCUMENTS

AU    2014101293 A4    11/2014
FR       3013362 B1    12/2015
(Continued)

OTHER PUBLICATIONS

International Search Report PCT/US2016/056964 dated Jan. 18, 2017, 1 pg.

*Primary Examiner* — Brent T O'Hern
(74) *Attorney, Agent, or Firm* — Abel Law Group, LLP; Robert N Young (57) ABSTRACT

A screen includes a mesh substrate having an openness of greater than 30% when viewed at 0° incidence, the mesh substrate having a first major surface and a second major surface, the first major surface including a first coating, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

10 Claims, 6 Drawing Sheets

(51) Int. Cl.
*C23C 14/20* (2006.01)
*G02B 5/02* (2006.01)
*C03C 25/10* (2018.01)
*D06M 101/22* (2006.01)
*D06N 3/00* (2006.01)
*D06N 3/06* (2006.01)

(52) U.S. Cl.
CPC ......... *G02B 5/0268* (2013.01); *G02B 5/0284* (2013.01); *D06M 2101/22* (2013.01); *D06N 3/0022* (2013.01); *D06N 3/06* (2013.01); *D06N 2209/0876* (2013.01); *D06N 2211/122* (2013.01); *D06N 2211/125* (2013.01)

(58) Field of Classification Search
USPC ........................................................ 428/105
See application file for complete search history.

(56) References Cited

U.S. PATENT DOCUMENTS

| | | |
|---|---|---|
| 8,042,598 B2 | 10/2011 | Bredemus et al. |
| 8,307,602 B2 | 11/2012 | Cochran, Jr. |
| 8,936,836 B2 | 1/2015 | Domes et al. |
| 2004/0188042 A1* | 9/2004 | Pylkki ...................... E06B 9/52 160/371 |
| 2008/0006375 A1 | 1/2008 | Meadows |
| 2008/0163988 A1 | 7/2008 | Hicks et al. |
| 2010/0043987 A1 | 2/2010 | Hicks et al. |
| 2011/0318590 A1 | 12/2011 | Maki et al. |
| 2012/0276332 A1 | 11/2012 | Conolly et al. |
| 2012/0321783 A1 | 12/2012 | Hampden-Smith et al. |
| 2013/0212789 A1 | 8/2013 | Conolly et al. |
| 2013/0213589 A1 | 8/2013 | Hicks et al. |
| 2014/0041285 A1 | 2/2014 | Russell et al. |
| 2016/0273155 A1 | 9/2016 | Crouzet et al. |

FOREIGN PATENT DOCUMENTS

| | | |
|---|---|---|
| JP | 2000027568 A1 | 1/2000 |
| JP | 20091744133 A | 8/2009 |
| WO | 2013177655 A1 | 12/2013 |
| WO | 2015071615 A1 | 5/2015 |

\* cited by examiner

OPEN MESH SCREEN

CROSS-REFERENCE TO RELATED APPLICATION

This application claims priority under 35 U.S.C. § 119(e) to U.S. Provisional App. No. 62/241,442, entitled "OPEN MESH SCREEN", by Sahas RATHI et al., filed Oct. 14, 2015, which is assigned to the current assignee hereof and incorporated herein by reference in its entirety.

FIELD OF THE DISCLOSURE

The present disclosure relates to open mesh screens and to methods of making the open mesh screens.

BACKGROUND

Screens are typically used to cover a window opening. Not only are they used to prevent entrance of insects into a window opening from the outside environment, but may also be used for privacy. Commercially available screens with a privacy functionality, however, are limited. For instance, it has been found that the privacy functionality of these commercially available screens is highly dependent on viewing angle and incidence angle of light, resulting in the privacy functionality being active only at certain viewing angles in the presence of light. Even in the absence of light, the privacy functionality is sensitive to viewing angle.

Accordingly, there is a need for an improved privacy screen.

SUMMARY

In an embodiment, a screen includes a mesh substrate having an openness of greater than 30% when viewed at 0° incidence, the mesh substrate having a first major surface and a second major surface, the first major surface comprising a first coating, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

In another embodiment, a method of making a screen includes providing a mesh substrate having an openness of greater than 30% when viewed at 0° incidence, the mesh substrate having a first major surface and a second major surface; and providing a first coating on a first major surface of the substrate, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

In yet another embodiment, a screen includes at least one first fiber oriented in a main direction of a mesh substrate; and at least one second fiber oriented in a cross direction of the mesh substrate, wherein the cross direction is different than the main direction, wherein the at least one first fiber and the at least one second fiber have a cross-section that is oval and wherein the at least one first fiber and the at least one second fiber are configured to intersect and provide an openness between the first fiber and the second fiber of greater than 30% when viewed at 0° incidence, the mesh substrate having a first major surface including a first coating, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be used in this application.

Before addressing details of the embodiments described below, some terms are defined or clarified. The term "warp" is intended to denote the fibers running lengthwise, or parallel to a machine direction, within the screen and the term "weft" is intended to denote the fibers running widthwise, or parallel to a cross direction, in the screen. "Reflectance value" is intended to denote the level of reflection in the visible reflectance range (380 nm to 780 nm) as well as infrared reflectance range (780 nm to 2500 nm), the level or reflectance measured using a spectrophotometer. "Reflectance" value is measured via an EN410 standard using a Perkin Elmer Lambda 950 instrument.

As used herein, the terms "comprises", "comprising", "includes", "including", "has", "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in reference books and other sources within the structural arts and corresponding manufacturing arts.

The present invention provides a screen including a mesh substrate, the mesh substrate having an openness of greater than 30%, such as 40%, or even 50% when viewed at 0° incidence. "0° incidence" as used herein refers to a view when standing directly perpendicular to the screen. The mesh substrate has a first major surface having a first reflectance value. Further, the mesh substrate has a second major surface having a second reflectance value. The first major surface of the screen has a desirable first reflectance value and a desirable reflection profile over any reasonable viewing angle. In an embodiment, the first reflectance value is greater than the second reflectance value.

In an embodiment, the screen is used for coverings for architectural openings, enclosures, and the like. Architectural openings include windows, doors, and the like. Enclosures include canopies, tents, pool and patio cages, and the like. The first major surface of the mesh substrate has a first reflectance value that provides privacy when viewed from an exterior of the opening to the interior of a structure. In an embodiment, the first reflectance value has an average value of greater than about 10%, such as greater than about 15%, or even greater than about 18%, as measured by the EN410 standard. It will be appreciated that the reflectance value can be above any of the minimum values noted above.

Further, the first major surface has a diffuse reflection profile when viewed from several angles. For instance, the first major surface has a diffuse reflection profile at all viewing angles from −89° to 89°, such as −87° to 87°, or −85° to 85°, excluding an angle of direct illumination as measured by a scattering distribution function technique using a Goniometer. Specifically, the angle of direct illumination is the angle at which the light beam is incident on the sample. A "diffuse reflection profile" as used herein refers to a substantially uniform reflectance when viewing the mesh screen at all angles from −89° to 89° with the exception of a singular reflection peak at the angle of direct illumination.

The diffuse reflection profile of the first major surface of the mesh substrate provides a reflectance when viewed at all angles from −89° to 89°, such as −87° to 87°, or −85° to 85°. The more uniform and diffuse reflectance profile of the first major surface provides greater privacy with a reduction in view through the open mesh substrate when viewed from all viewing angles from −89° to 89°, such as −87° to 87°, or −85° to 85°, compared to conventional coated mesh screens. Comparably, conventional coated mesh screens have a specular reflection profile with a lower reflectance at most viewing angles. In fact, the specular reflection profile of the conventional coated mesh screens only provides reflectance and privacy at a few angles. This is further described in the Examples.

The second major surface of the substrate has a second reflectance value. The second reflectance value provides a minimally unobstructed view from the interior of the opening to the exterior of the structure. Any reflectance value is envisioned. For instance, the second reflectance is an average value of at least less than about 3%, as measured by EN410. In an alternative embodiment, the second reflectance value may be an average value greater than about 3%, as measured by EN410. In an embodiment, the second reflectance value is provided by a second coating on the second major surface of the substrate. In an alternative embodiment, the second reflectance value is provided without a second coating but is achieved by selection of the material of the open mesh substrate.

In an embodiment, the mesh substrate can comprise any suitable configuration with the proviso that the mesh substrate has an openness of at least about 30%, at least about 40%, or at least about 50% when viewed at 0° incidence. In an embodiment, the mesh substrate is a continuous sheet with at least a portion of the continuous sheet having a plurality of holes to provide an openness. Any number of layers for the mesh substrate may be envisioned, with the number of layers being the same or different materials.

In another embodiment, the mesh substrate includes at least one first fiber and at least one second fiber. In a particular embodiment, the at least one first fiber is oriented in a main direction of an open mesh substrate. The at least one second fiber is oriented in a cross direction of the open mesh substrate, the cross direction different from the main direction. The at least one first fiber and the at least one second fiber are configured to intersect and provide the openness as described. The screen can include one or more of the at least one first fiber, such as a plurality of first fibers. The screen also can include one or more of the at least one second fiber, such as a plurality of second fibers. In an embodiment, one or more of the first and/or second fibers may be described as monofilaments Skilled artisans will appreciate, however, that each of the first fibers and second fibers may include other configurations. For example, one or more of the first fibers and the second fibers may include a multi-strand, plied or unplied (e.g., ordered or unordered) configuration of one or more suitable materials. In an embodiment, the multi-strand plied configuration includes an ordered configuration such as a yarn. One or more of the first fibers and the second fibers also may include a multi-strand unordered configuration, such as a roving. Any suitable configuration for each of the first and second fibers is envisioned. In an embodiment, the first and second fibers include the same configuration. In another embodiment, the first and second fibers include different configurations.

Any suitable materials for the mesh substrate are envisioned. For instance, any suitable materials are envisioned for the mesh substrate and in an embodiment, include any suitable organic or inorganic material. In an embodiment, suitable materials include any polymeric material such as any thermoset polymer or thermoplastic polymer (e.g., polyester), any metal material, fiberglass, or combination thereof. In an embodiment, the mesh substrate includes one or more of the first fibers and the second fibers that are multifilaments of fiberglass. In another embodiment, one or more of the first fibers and the second fibers may include monofilaments or multifilaments of fiberglass, steel, aluminum, polyester, polyethylene, polypropylene, polyamide, polyimide, a liquid crystalline polymer, fluoropolymer, or any combination thereof. In an embodiment, the first fibers and the second fibers may be the same or different materials.

Any suitable dimension for each of the first fibers and the second fibers is also envisioned for the screen, whether the fibers are in a monofilament or multifilament configuration. In an embodiment, each of the first fibers and the second fibers has a cross section that is non-circular, such as oval or rectangular. "Oval" as used herein refers to a cross-section that has an x-axis/y-axis value of greater than about 1.05, greater than about 1.10, greater than about 1.20, greater than about 1.30, greater than about 1.40, or even greater than about 1.50. In a particular embodiment, the fibers as aligned such that the x-axis is in a horizontal plane of the screen. Although not bound by theory, it is surmised that the cross section of the fiber contributes to the unexpected diffuse reflection profile. In particular, the cross section shape contributes to the enhanced reflectance values and enhanced privacy. For instance, commercially available screens typically have a cross section that is round (circular), i.e. with an x-axis/y-axis of about 0.98 to about 1.01.

In an embodiment, each of the first fibers and the second fibers can include various diameters and densities with the proviso that the openness of the mesh substrate is maintained. For example, the diameter of one or more of the first fibers and the second fibers can include a diameter in the range of about 10 microns to about 635 microns, such as about 120 microns to about 635 microns, such as about 120 microns to about 500 microns, or even about 175 microns to about 350 microns. It will be appreciated that the diameter can be within a range between any of the minimum values and maximum noted above. In an embodiment, one or more of the first fibers and the second fibers include the same diameter. In another embodiment, one or more of the first fibers and the second fibers include different diameters.

In an embodiment, the densities of each of the first fibers and the second fibers in the screen can include any reasonable densities, depending on the purpose for which the screen is intended. In an embodiment, the density of one or more of the first fibers and the second fibers is about 9 fibers per inch and about 60 fibers per inch. In a particular embodiment, the density of the at least one first fiber is about 14 fibers per inch to about 24 fibers per inch. In another particular embodiment, the density of the at least one second fiber is about 14 fibers per inch to about 24 fibers per inch. It will be appreciated that the density can be within a range between any of the minimum values and maximum noted above. In an embodiment, the density of the at least one first fiber and the density of the at least one second fiber is the same. In an alternative embodiment, the density of the at least one first fiber and the density of the at least one second fiber is different. Although at least one first fiber and at least one second fiber are described, the screen can include any number of additional fibers such as at least one third fiber, at least one fourth fiber, etc. in any reasonable direction of the substrate. In an embodiment, the screen in designed to prevent insects from entering through a window or passing through the screen.

In an embodiment, the first major surface of the substrate has a first coating. The first coating for the first major surface includes any reasonable metal. The metal within the first coating provides the first reflectance value as described. In an embodiment, the metal includes aluminum, iron, nickel, copper, zinc, titanium, gold, silver, chromium, platinum, steel, antimony, tin, an alloy of the metal, an oxide of the metal, or combination thereof. In a certain embodiment, the first coating consists essentially of the metal described above. As used herein, the phrase "consists essentially of" used in connection with the metal coating precludes the presence of other components that affect the basic and novel characteristics of the metal. In a more particular embodiment, the first coating consists of the metal as described above.

In an alternative embodiment, the metal is present in a polymeric binder. Any amount of the metal is reasonable to provide the advantageous reflectance value and enhanced privacy. For instance, the metal is present at an amount of 1% to about 50% by weight within a polymeric binder, based on the total weight of the polymeric binder. It will be appreciated that the amount can be within a range between any of the minimum values and maximum noted above. Any polymeric binder is envisioned such as a thermoset polymer or a thermoplastic polymer. Exemplary polymeric binders are a polyvinyl chloride (PVC) such as a dispersion of PVC within a blending resin, a polyolefin such as polyethylene or polypropylene, a polyamide, a polyurethane, a silicone, an epoxy resin, an acrylic resin, a polyester, a polyimide, a polyacrylate, a fluorinated polymer, a fluoropolymer, an elastomer, a polyether ether ketone (PEEK), a polyphenylene sulfide (PPS), or any combination of these polymers. In a particular embodiment, the polymeric binder is plastisol and the plastisol includes a dispersion of PVC within a blending resin, a plasticizer, and one or more additives.

In an embodiment, the first coating further includes a coloring agent to provide color to the first coating. Any reasonable coloring agent, such as a colorant or pigment, is envisioned that alters the optical properties of the first coating. An exemplary coloring agent provides any color desired such as black, red, yellow, orange, blue, green, purple, white, and combinations thereof. For instance, the coloring agent includes carbon black, iron black pigments, and the like as black pigments; quinacridone pigments, cromophtal pigments, azo pigments, diketopyrrolopyrrole pigments, anthraquinone pigments, and the like as red pigments; azo pigments, imidazolone pigments, titanium yellow pigments, and the like as yellow pigments; indanthrene pigments, azo pigments, and the like as orange pigments; phthalocyanine pigments, ultramarine blue, iron blue, and the like as blue pigments; phthalocyanine pigments and the like as green pigments; dioxazine pigments, quinacridone pigment, and the like as purple pigments; and titanium oxide, aluminum silicate, silicon oxide, and the like as white pigments. In a particular embodiment, the coloring agent is present at an amount to provide any desirable color. For instance, the amount is typically dependent upon the coloring agent as well as the desired color. For instance, the coloring agent is present at an amount of at least about 1.0 wt %, based on the total weight % of the first coating. In an embodiment, the coloring agent is present in an amount of about 1.0 wt % to about 10.0 wt %, or even about 3.0 wt % to about 8.0 wt % based on the total weight % of the first coating. It will be appreciated that the amount can be within a range between any of the minimum values and maximum noted above.

In addition to the polymer, the first coating can include any suitable crosslinking agent, catalyst, free radical initiator, or combination thereof. In an embodiment, the first coating can also include a plasticizer, a thermal stabilizer, a paste, an anti-static agent, an anti-flaming agent, a lubricant, a stabilizer, a surfactant, a thickener, or any combination of these substances, all present in any reasonable amount.

In a particular embodiment, the first major surface has a desirable surface roughness. Although not being bound by theory, the surface roughness contributes to the unexpected diffuse reflection profile as described. In an embodiment, the first major surface has an average surface roughness of greater than about $0.1\mu$, greater than about $0.15\mu$, or greater than about $0.20\mu$, as measured using an optical surface profilometer. Typically, commercially available screens have an average surface roughness of less than $0.09\mu$, as measured using an optical surface profilometer. In a particular embodiment, the surface roughness of the first major surface in combination with the cross section of the diameters of the fibers contributes to the advantageous reflectance and enhanced privacy. In a more particular embodiment, the combination particularly contributes to the value of reflectance that is maintained over any viewing angle and incidence angle with or without light. In an example, the surface roughness provides a higher reflectance value compared to a first major surface with a surface roughness less than $0.09\mu$.

In an embodiment, the second major surface includes a coating, herein denoted as a second coating. The second coating is optional and may provide the second reflectance value as described. In an embodiment, the second coating includes any reasonable polymer such as any reasonable thermoplastic or thermoset polymer. In an embodiment, the second coating includes a polyvinyl chloride (PVC) such as a dispersion of PVC within a blending resin, a polyolefin such as polyethylene or polypropylene, a polyamide, a polyurethane, a silicone, an epoxy resin, an acrylic resin, a polyester, a polyimide, a polyacrylate, a fluorinated polymer, a fluoropolymer, an elastomer, a polyether ether ketone (PEEK), a polyphenylene sulfide (PPS), or any combination of these polymers. In a particular embodiment, the polymeric binder is plastisol and the plastisol includes a dispersion of PVC within a blending resin, a plasticizer, and one or more additives. In another embodiment, the polymer of the second coating includes other suitable additives, such as coloring agent, stabilizers, surfactants or thickeners.

In an embodiment, the second coating further includes a coloring agent to provide color to the second coating. Any reasonable coloring agent, such as a colorant or pigment, is envisioned that alters the optical properties of the second coating. An exemplary coloring agent provides any color desired such as black, red, yellow, orange, blue, green, purple, white, and combinations thereof. For instance, the coloring agent includes any of the pigments described for the first coating. In a particular embodiment, the coloring agent is present at an amount to provide any desirable color. For instance, the amount is typically dependent upon the coloring agent as well as the desired color. For instance, the coloring agent is present at an amount of at least about 1.0 wt %, based on the total weight % of the second coating. In an embodiment, the coloring agent is present in an amount of about 1.0 wt % to about 10.0 wt %, or even about 3.0 wt % to about 8.0 wt % based on the total weight % of the second coating. It will be appreciated that the amount can be within a range between any of the minimum values and maximum noted above.

In addition to the polymer, the second coating can include any suitable crosslinking agents, catalysts, and free radical initiators. In an embodiment, the second coating can also include a plasticizer, a paste, an anti-static agent, a lubricant, an anti-flaming agent, or any combination of these substances, all present in any reasonable amount. In an embodiment, the second coating includes a different coating than the first coating such that the first coating and the second coating have different reflectance values. In an alternative embodiment, the second major surface is substantially free of a coating and the reflectance value is provided by the reflectance properties of the first fiber and the second fiber of the substrate.

The thickness of each of the first coating and the optional second coating on their respective major surfaces includes any reasonable range of thicknesses. In a particular embodiment, each of the first coating and the optional second coating can include a thickness of about 1 nanometer to about 500 microns on a first major surface and a second major surface, respectively. In an embodiment, the first coating has a thickness of about 10 nanometers to about 2 microns, such as about 10 nanometers to about 200 nanometers, such as about 10 nanometers to about 100 nanometers, such as about 10 nanometers to about 50 nanometers. It will be appreciated that the thickness can be within a range between any of the minimum values and maximum noted above. In an embodiment, the thickness of the first coating and the optional second coating may be the same. In an alternative embodiment, the thickness of the first coating and the optional second coating is different.

Each of the first coating and the optional second coating also coat any suitable amount of each first major surface and second major surface, respectively. For example, each of the first coating and the optional second coating can coat substantially all of a first major surface and a second major surface, respectively. In another embodiment, each of the first coating and the optional second coating can coat at least 50% of a first major surface and a second major surface respectively, such as at least 60%, at least 70%, or even at least 75%. In yet another embodiment, each of the first coating, the optional second coating, or combination thereof can include a uniform coating, a homogenous coating, or a continuous coating on a first major surface and a second major surface, respectively. In an embodiment, the first coating, the optional second coating, or combination thereof is discontinuous on the first major surface and a second major surface, respectively.

Any additional coating may be included on the screen. For instance, a coating may be placed on the first major surface, the second major surface, or any combination thereof. In an exemplary embodiment, the additional coating may underlie the first coating, the second coating, or combination thereof. In an embodiment, the additional coating may be in direct contact with the fibers of the screen. In another embodiment, the additional coating may overlie the first coating, the second coating, or combination thereof. For instance, a coating may include a primer layer, a polymer layer, an adhesion layer, a blocker layer, a topcoat layer, or combination thereof. The polymer layer may be any reasonable polymer described for the polymeric binder. In a specific embodiment, an additional coating of a polymer layer underlies the first coating.

In an embodiment, an adhesion layer is provided to increase the adhesion of at least the first coating to the mesh substrate. Any reasonable adhesion layer is envisioned. In a particular embodiment, the adhesion layer includes an oxide-based material, a nitride-based material, or combination thereof. Any oxide-based material is envisioned and includes a metal, a non-metal, or combination thereof. For instance, the oxide-based material may be titanium oxide ($TiO_2$), tin-zinc oxide (SnZnO), silicon oxide (SiO), or combination thereof. Any nitride-based material is envisioned and includes a metal, a non-metal, or combination thereof. For instance, the nitride-based material may be silicon nitride. When present, any thickness of the adhesion layer is envisioned. For instance, the adhesion layer may be at a thickness of greater than 0 and less than 100 nm, such as about 1 nm to about 100 nm. Any thickness values can be envisioned within the minimum and maximum values.

Within the screen, the mesh substrate can include any suitable configuration with the proviso that the mesh substrate has an openness of at least about 30%. In a particular embodiment, the mesh substrate includes the first fibers and the second fibers that can intersect either in a woven or non-woven configuration. "Woven" as used herein describes at least first fibers and at least second fibers that they may be woven together using any reasonable weave. In a particular embodiment, the first fibers and the second fibers are configured in a plain weave where each of the second fibers are carried over and under each of the first fibers, with each row of second fibers alternating, to produce a high number of intersections between the first fibers and the second fibers. In another embodiment, the first fibers and the second fibers can be configured in a leno weave where two or more first fibers can be twisted around each other as they are interlaced with one or more second fibers, or they can be configured in a half-leno weave. For each weave used, the screen and the configurations of the first fibers and the second fibers can also be altered by changing the densities (e.g., increasing or decreasing the number of fibers in a given distance, such as increasing or decreasing the number of fibers per inch) of either or both of the first fibers or the second fibers in their respective directions. "Non-woven" as used herein refers to knit, laid, or extruded.

The directions in which the first fibers and the second fibers are oriented within the screen also include any reasonable orientations. For example, the first fibers can be oriented in a main direction of the screen, such as a direction that is parallel to the length of the screen. In an embodiment, the second fibers may be oriented in a direction of the screen that is different from the orientation of the first fibers, such as in a cross direction with an angle of 10° to about 90° relative to the first fibers in the main direction. In an embodiment, the cross direction is parallel to the width of the screen or perpendicular (90°) relative to the orientation of the first fibers. In a particular embodiment, the first fibers include the warp of the screen and the second fibers include the weft of the screen.

The screen can include a variety of dimensions and is useful for both indoor and outdoor applications. For example, the width of the screen can be between about 0.1 meters and about 2.7 meters and the length of the screen can be between about 2 meters and about 1,100 meters. Any dimension is envisioned depending upon the end-use for the mesh screen.

Turning to an exemplary method of making the screen, any method is envisioned depending upon the mesh substrate. For instance, the mesh substrate may be a continuous sheet of polymer with holes provided by any means desired. In an example, the continuous sheet may be extruded or molded. In an embodiment, the mesh substrate is provided having at least one first fiber and at least one second fiber as described above. In an embodiment, the at least one first fiber is oriented in a main direction and the at least second fiber is oriented in a cross direction. The at least one first fiber and the at least one second fiber are configured to intersect and provide a substrate. The openings between the intersection of the respective fibers provides an openness between the first fiber and the second fiber of greater than about 30%, such as about 40%, or even about 50% when viewed at 0° incidence.

The first fibers and the second fibers may be oriented in any two reasonable orientations and configured to intersect. The first fibers are oriented in the main direction of the screen which, in a particular embodiment, can include the warp of the screen while the second fibers are oriented in a different direction, such as the cross direction of the screen which, in an embodiment, can include the weft of the screen.

When non-woven, the first fibers and the second fibers can be knit, laid, or extruded using any reasonable technique envisioned. When woven, any reasonable weaving technique is envisioned. For instance, the first fibers and the second fibers are woven together using a plain weave, a leno weave, or a half leno weave as described above or using any other reasonable weaving technique. For example, the first fibers and the second fibers can be woven together using machines produced by Sulzer, Picanol, Dornier, or Smit Textile.

In an embodiment, the substrate has a first major surface that is coated with a first coating. Any reasonable coating method is envisioned, such as by vacuum deposition, screen printing, dip coating, extrusion coating, wet coating, transfer coating, or combination thereof. In an embodiment, the first coating is coated via vacuum deposition. Vacuum deposition includes magnetron sputtering, evaporation with and without plasma, electrodeless plating, plasma spray, and the like. In a more particular embodiment, the vacuum deposition is metallization.

In an embodiment, a second major surface of the substrate is coated with a second coating. Any reasonable coating method is envisioned, such as by a dip coating, extrusion coating, vacuum deposition, screen printing, or combination thereof. In an embodiment, the second coating is coated via dip coating or extrusion coating. In an alternative embodiment, the second major surface of the substrate does not contain a coating. For instance, the material of the second major surface of the substrate is chosen to provide the second reflectance value.

The first fibers and the second fibers may be fixed with any reasonable means to secure the position of the first fibers and the second fibers relative to one another and their intersections within the screen. To "fix" the position of the first fibers and the second fibers relative to one another and their intersections, as used herein, is to refer to the position of the fibers relative to one another and their intersections as remaining unchanged. In an embodiment, the first fibers and/or the second fibers may include a polymer coating to fuse the fibers. In a particular embodiment, the polymer coating may be the same or different than the first coating, the optional second coating, or combination thereof.

In a particular embodiment, the screen is fixed using a heated means to cure the polymer coating, the first coating, the optional second coating, or combination thereof. Any reasonable heating temperature and conditions are envisioned depending upon the coating chosen. For example, the heating temperature can include a value in the range of between about 160° Celsius to about 250° Celsius. The time needed to fix the screen can also include various times, including a curing time of between about 5 seconds to about 30 seconds, depending on the polymer coating, the first coating, optional second coating, or combination thereof. In a particular embodiment, tentering or thermal bonding can be used to cure the polymer coating, the first coating, the optional second coating, or combination thereof and to fix the intersections between the first fibers and the second fibers. In a further particular embodiment, the heat applied to the screen cures the polymer coating, the first coating and the optional second coating at a single temperature, obviating the need for the polymer coating, the first coating and the optional second coating to be cured at a different temperature Skilled artisans will further appreciate that any reasonable sequence of orienting the at least one first fiber and the at least second fiber, intersecting, coating, curing or fixing are envisioned to make the screen.

In an embodiment, the non-circular cross-section of the fibers is achieved by providing mechanical compression to the fibers. For instance, any method of providing ovality is envisioned such as mechanical compression as between two parallel surfaces Skilled artisans will further appreciate than any reasonable sequence of providing ovality is envisioned, such as before intersecting, coating, curing, fixing, or weaving.

In an embodiment, the surface roughness of the first major surface is achieved by any reasonable method. Any method of providing surface roughness is envisioned such as mechanical abrading, chemical treatment, plasma treatment, ion bombardment, nano/micro embossing, corona discharge treatment, and the like Skilled artisans will further appreciate than any reasonable sequence of providing surface roughness is envisioned, such as before intersecting, coating, curing, fixing, or weaving.

Any further steps can be included to improve the mechanical durability of the first coating, the optional second coating, or combination thereof. For instance, an adhesion coating may be applied by any reasonable methods prior to the application of the first coating, the optional second coating, or combination thereof. Typically, the adhesion coating is applied directly to the first major surface, the second major surface, or combination thereof with the first coating, the optional second coating, or combination thereof applied thereon. In an embodiment, a top coating may be applied over the first coating, the second coating, or combination thereof. In yet another embodiment, the fibers may be surface treated by any reasonable surface treatment envisioned such as plasma treatment, corona discharge treatment, chemical treatment, ion bombardment, mechanical abrading, or combination thereof. Any combination of coating and treatment may be envisioned.

Figure 1:
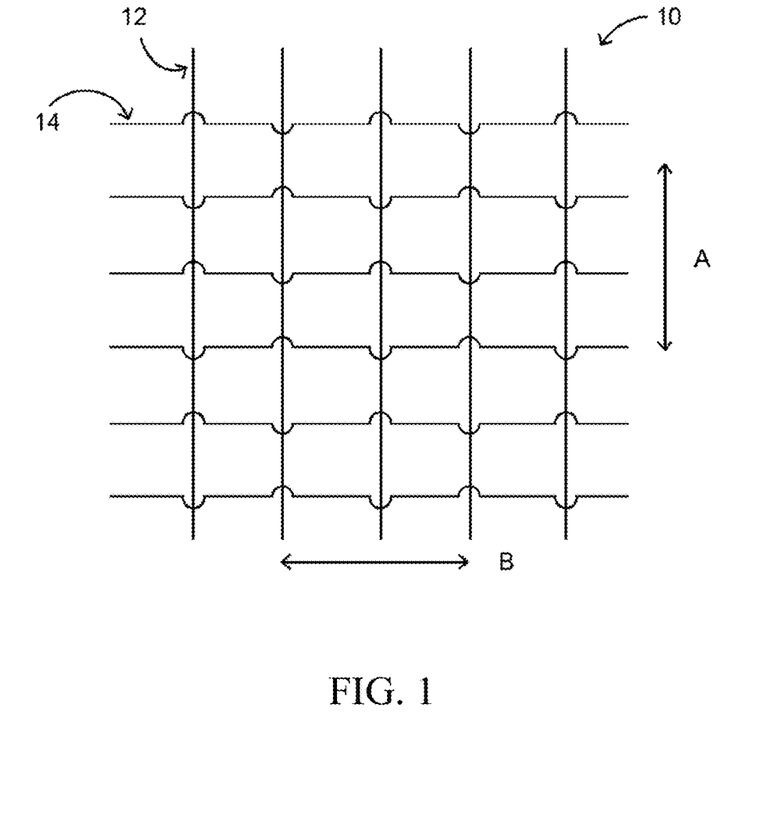
FIG. 1 includes an illustration of a mesh screen in accordance with an embodiment described herein.

Turning to FIG. 1, a screen is illustrated. The screen 10 includes first fibers 12 and second fibers 14 as described above. First fibers 12 are oriented in a direction parallel to line A that, in an embodiment, can include the main direction of the screen. Second fibers 14 are oriented in a cross direction of the screen that is different than the main direction. That is, second fibers 14 are oriented in a direction parallel to line B that, in an embodiment, is perpendicular to line A and perpendicular to main direction of screen 10. Although the second fibers 14 are illustrated in perpendicular to the main direction of screen 10, any angle of the second fibers 14 in the cross direction are envisioned. In a particular embodiment, first fibers 12 comprise the warp of screen 10 and second fibers 14 comprise the weft of screen 10. First fibers 12 and second fibers 14 are configured to intersect in any configuration. As illustrated, the first fibers 12 and second fibers 14 are configured in a plain weave, where each of second fibers 14 are carried over and under each of first fibers 12 and each row of second fibers 14 alternates to produce a high number of intersections of first fibers 12 and second fibers 14. Although not illustrated, any further number of fibers in any reasonable direction may be envisioned, with the proviso that they provide an openness between the intersection of the fibers of greater than about 30%, such as about 40%, or even about 50% when viewed at 0° incidence.

Applications for the mesh screen are numerous. The mesh screen as described above is able to provide privacy when viewing from an exterior of the screen to an interior structure at any viewing angle and incidence angle. In an embodiment, the mesh screen also has a desirable solar reflectance such as a value of greater than about 10%, such as greater than about 20%, compared to an uncoated mesh screen with a solar reflectance of less than about 5%, when measured at a wavelength of 780 nm to 2500 nm. In a particular embodiment, the yarn morphology of oval shape and surface roughness of the mesh screen provides a more diffuse reflection as a function of angle, compared to a yarn having a round shape and smooth surface, i.e. a commercially available mesh. The mesh screen of the present invention reduces the view through an open mesh substrate more uniformly across several viewing angles compared to commercially available mesh. With commercially available mesh, the round and smooth morphology of the yarn provides a reflection as function of angle that is specular, resulting in the view through their open mesh substrate being reduced only from certain viewing angles. Further, the configuration of the fibers of the screen provides a minimally unobstructed view from the interior of a structure to the exterior of the structure. The mesh screen can be employed in many end-use applications where privacy is desired. For instance, the mesh screen can include a variety of dimensions and is useful for both indoor and outdoor applications. In an embodiment, the mesh screen may be part of an indoor window covering system that includes a screen to prevent insects from entering through the window. In other embodiments, the mesh screen may be used as a fence or to provide a mesh covering for vents, tents, porches, and patios. Further end-use applications include, for example, any fabric configuration for building construction applications and as stand-alone coated mesh screens in filters, screens and garment applications.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the items as listed below.

Embodiment 1. A screen including a mesh substrate, the mesh substrate having an openness of greater than 30% when viewed at 0° incidence, the mesh substrate having a first major surface and a second major surface, the first major surface including a first coating, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

Embodiment 2. A method of making a screen including providing a mesh substrate having an openness of greater than 30% when viewed at 0° incidence, the mesh substrate having a first major surface and a second major surface; and providing a first coating on a first major surface of the substrate, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

Embodiment 3.The screen or method of making the screen of any of the preceding embodiments, wherein the second major surface has a second reflectance value, the second average reflectance value less than about 3% as measured by EN410 standard.

Embodiment 4.The screen or method of making the screen of any of the preceding embodiments, wherein the first coating includes a metal.

Embodiment 5.The screen or method of making the screen of embodiment 4, wherein the metal includes aluminum, iron, nickel, copper, zinc, titanium, gold, silver, chromium, platinum, steel, antimony, tin, an alloy of the metal, an oxide of the metal, or combination thereof.

Embodiment 6.The screen or method of making the screen of any one of the preceding embodiments, wherein the second major surface includes a second coating including a polymer.

Embodiment 7.The screen or method of making the screen of embodiment 6, wherein the polymer includes plastisol, polyvinyl chloride (PVC), polyethylene, polypropylene, polyamide, polyester, polyurethane, polyimide, polyacrylate, fluorinated polymer, or combinations thereof.

Embodiment 8.The screen or method of making the screen of embodiment 1, wherein the mesh substrate includes at least one first fiber oriented in a main direction of an open mesh substrate; and at least one second fiber oriented in a cross direction of the open mesh substrate, wherein the cross direction is different than the main direction, wherein the at least one first fiber and the at least one second fiber are configured to intersect.

Embodiment 9.The screen or method of making the screen of embodiment 8, wherein the at least one first fiber and the at least one second fiber are woven, knit, laid, or extruded.

Embodiment 10.The screen or method of making the screen of embodiment 8, wherein the at least one first fiber and the at least one second fiber have a cross-section that is oval.

Embodiment 11.The screen or method of making the screen of embodiment 10, wherein the at least one first fiber and the at least one second fiber have a cross-section that has an x-axis/y-axis value of greater than about 1.05, greater than about 1.10, greater than about 1.20, greater than about 1.30, greater than about 1.40, or even greater than about 1.50.

Embodiment 12.The screen or method of making the screen of embodiment 8, wherein the at least one first fiber and the at least one second fiber include monofilaments or multifilaments of fiberglass, steel, aluminum, polyester, polyethylene, polypropylene, polyamide, or combinations thereof.

Embodiment 13.The screen or method of making the screen of any of the preceding embodiments, wherein the first major surface has an average surface roughness of greater than about 0.1μ, greater than about 0.15μ, or greater than about 0.20μ.

Embodiment 14.The screen or method of making the screen of any of the preceding embodiments, wherein the first coating is homogenous and continuous on the first major surface of the substrate.

Embodiment 15.The screen or method of making the screen of any of the preceding embodiments, wherein the first coating is discontinuous on the first major surface of the substrate.

Embodiment 16.The screen or method of making the screen of any of the preceding embodiments, wherein the first coating has a thickness within a range of about 1 nanometer and about 500 microns.

Embodiment 17.The screen of embodiment 8, wherein the cross direction is at an angle of about 10° to about 90° relative to the main direction.

Embodiment 18.The method of embodiment 2, including providing the first coating by vacuum deposition, wet coating or transfer coating.

Embodiment 19.The method of embodiment 2, further including providing a second coating on a second major surface of the substrate.

Embodiment 20.The method of embodiment 2, further including providing the second coating via dip coating or extrusion coating.

Embodiment 21.The method of embodiment 2, wherein providing the mesh substrate includes orienting in a main direction of an open mesh substrate at least one first fiber; orienting in a cross direction of the open mesh substrate at least one second fiber, wherein the at least one first fiber and the at least one second fiber are configured to intersect.

Embodiment 22.The method of embodiment 21, wherein the cross direction is at an angle of about 10° to about 90° relative to the main direction.

Embodiment 23.A screen including at least one first fiber oriented in a main direction of a mesh substrate; and at least one second fiber oriented in a cross direction of the mesh substrate, wherein the cross direction is different than the main direction, wherein the at least one first fiber and the at least one second fiber have a cross-section that is oval and wherein the at least one first fiber and the at least one second fiber are configured to intersect and provide an openness between the first fiber and the second fiber of greater than 30% when viewed at 0° incidence, the mesh substrate having a first major surface comprising a first coating, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

The following Examples are provided to better disclose and teach processes and compositions of the present invention. It is for illustrative purposes only, and it must be acknowledged that minor variations and changes can be made without materially affecting the spirit and scope of the invention as recited in the claims that follow.

EXAMPLES

Exemplary screens can be seen in Table 1 below with average reflectance values and ovality. Reflectance values are measured on a major surface of each sample using a D65 light source and an EN410 standard to provide the average reflectance value. Samples 1-5 are fiberglass fibers coated with a flexible polyvinyl chloride (PVC) with a metal coating indicated as aluminum (Al) or stainless steel (SS). The Comparison sample is a mesh of polymer fibers coated with stainless steel. As seen in Table 1, the average reflectance values for Samples 1-5 are all greater than the comparison sample. A higher average reflectance indicates greater privacy functionality.

TABLE 1

| Sample | Construction (yarns/inch) | Yarn (diameter in inches) | Openness range (%) | Ovality | Average reflectance (%) |
|---|---|---|---|---|---|
| 1 (Al) | 18 × 14 | 0.013 | 56-58 | 1.34 | 30-32 |
| 2 (Al) | 18 × 16 | 0.011 | 60-62 | 1.54 | 25-27 |
| 3 (Al) | 18 × 18 | 0.009 | 64-65 | 1.25 | 20-22 |
| 4 (Al) | 20 × 20 | 0.008 | 67-69 | 1.25 | 20-22 |
| 5 (SS) | 18 × 16 | 0.011 | 60-62 | 1.54 | 16-18 |
| Comparison (SS) | 20 × 20 | 0.008 | 71-72 | 1.01 | 10-12 |

Surface roughness measurements are performed using Nanovea 3D Optical Surface Profilometer for Sample 2 and the Comparison sample. Two dimensional line profiles are extracted along the screen fibers for surface roughness measurements. Three fibers from each of the three scans per sample provide roughness data. The aluminum coated sample of Sample 2 has a surface roughness of 0.284 μm with a standard deviation of 0.046 μm. The Comparison sample has a surface roughness of 0.07 μm with a standard deviation of 0.005 μm. Notably, the Sample 2 has a surface roughness that is at least four times greater than the Comparison sample.

Light transmittance and solar transmittance are measured with a Perkin Elmer Lambda 950 with the illumination directly on the sample, while the angle of the sample is changed. Light transmittance is measured with a D65 light source. Solar transmittance is measured using the EN410 standard. Contrast is measured using the following equation: Contrast=$T(\Theta)/R$(integrated) where T is light transmission related to angle and R is reflectance value normal (i.e. perpendicular) to the sample surface. The lower the contrast, the higher the privacy. Results can be seen in Tables 2, 3, 4, 5, and 6.

TABLE 2

Comparison sample

| Angle (°) | Light transmittance | Solar transmittance | L*(D65/ 2°) | a*(D65/ 2°) | b*(D65/ 2°) | Contrast |
|---|---|---|---|---|---|---|
| 0 | 66.75 | 67.6 | 85.3741 | −0.0225 | −0.0464 | 6.38 |
| 15 | 67.47 | 67.67 | 85.7383 | −0.0418 | −0.0742 | 6.44 |
| 30 | 67.12 | 66.79 | 85.5597 | −0.0235 | −0.0655 | 6.41 |
| 45 | 63.29 | 63.12 | 83.5953 | −0.0292 | −0.0064 | 6.04 |
| 60 | 54.34 | 54.42 | 78.6587 | −0.0652 | −0.1056 | 5.19 |
| 75 | 32.17 | 32.03 | 63.477 | −0.1413 | −0.2346 | 3.07 |

TABLE 3

Sample 1 Al (25 nm thickness) coating

| Angle (°) | Light transmittance | Solar transmittance | L*(D65/ 2°) | a*(D65/ 2°) | b*(D65/ 2°) | Contrast |
|---|---|---|---|---|---|---|
| 0 | 52.29 | 52.28 | 77.4528 | −0.232 | −0.789 | 1.66 |
| 15 | 53.81 | 53.42 | 78.3547 | 0.0304 | 0.109 | 1.71 |
| 30 | 51.58 | 51.8 | 77.0286 | −0.0102 | −0.0348 | 1.64 |
| 45 | 49.08 | 49.48 | 75.5046 | −0.0203 | −0.0051 | 1.56 |
| 60 | 41.52 | 41.63 | 70.5393 | −0.0435 | −0.045 | 1.32 |
| 75 | 17.29 | 17.25 | 48.6164 | −0.1952 | −0.2848 | 0.55 |

TABLE 4

Sample 2 Al (25 nm thickness) coating

| Angle (°) | Light transmittance | Solar transmittance | L*(D65/ 2°) | a*(D65/ 2°) | b*(D65/ 2°) | Contrast |
|---|---|---|---|---|---|---|
| 0 | 62.01 | 61.1 | 82.9134 | −0.0519 | −0.058 | 2.38 |
| 15 | 57.07 | 58.12 | 80.2203 | 0.011 | −0.0147 | 2.19 |
| 30 | 59.98 | 59.27 | 81.8303 | −0.0221 | −0.034 | 2.31 |
| 45 | 55.45 | 55.53 | 79.2946 | −0.0611 | −0.0972 | 2.13 |
| 60 | 47.77 | 48.02 | 74.6759 | −0.0722 | −0.1289 | 1.84 |
| 75 | 24.28 | 24.2 | 56.3664 | −0.17 | −0.27 | 0.93 |

TABLE 5

Sample 3 Al (25 nm thickness) coating

| Angle (°) | Light transmittance | Solar transmittance | L*(D65/ 2°) | a*(D65/ 2°) | b*(D65/ 2°) | Contrast |
|---|---|---|---|---|---|---|
| 0 | 66.25 | 65.8 | 85.1248 | −0.0527 | −0.0566 | 3.08 |
| 15 | 65.27 | 64.87 | 84.6263 | 0.0245 | 0.0514 | 3.04 |
| 30 | 60.13 | 60.99 | 81.9111 | −0.0197 | −0.0347 | 2.80 |
| 45 | 59.85 | 59.45 | 81.7606 | −0.0226 | −0.0646 | 2.79 |
| 60 | 51.19 | 51.16 | 76.7913 | −0.0471 | −0.0414 | 2.38 |
| 75 | 31.65 | 31.52 | 63.0496 | −0.1418 | −0.1583 | 1.47 |

TABLE 6

Sample 4 Al (25 nm thickness) coating

| Angle (°) | Light transmittance | Solar transmittance | L*(D65/ 2°) | a*(D65/ 2°) | b*(D65/ 2°) | Contrast |
|---|---|---|---|---|---|---|
| 0 | 61.39 | 61.98 | 82.5876 | −0.0287 | −0.0393 | 2.95 |
| 15 | 62.76 | 62.58 | 83.3201 | −0.008 | −0.0656 | 3.02 |
| 30 | 62.18 | 61.89 | 83.0079 | −0.0562 | −0.0797 | 2.99 |
| 45 | 56.99 | 57.98 | 80.1713 | −0.0311 | −0.0759 | 2.74 |
| 60 | 50.72 | 50.64 | 76.5059 | −0.0511 | −0.1017 | 2.44 |
| 75 | 26.96 | 26.96 | 58.933 | −0.1718 | −0.2939 | 1.30 |

The order of contrast for the samples is consistent with visual observation. Samples 1-4 all have lower contrast, i.e. greater privacy, compared to the Comparison sample.

Sample 4 has a construction most similar to the Comparison sample. Sample 3 has a light transmittance most similar to the Comparison sample. Clearly, the ovality of the fibers of Sample 3 provides the improved light transmittance. In particular, it is surmised that the rounded cross-section of the fiber of the Comparison sample, when viewed at any angle, provides a surface viewing area that does not substantially change (due to the substantially uniform diameter of the fiber). In contrast, the fibers of Sample 3 have an ovality that provides a larger surface viewing area at varying viewing angles, thus providing an improved light transmittance.

Figure 2:
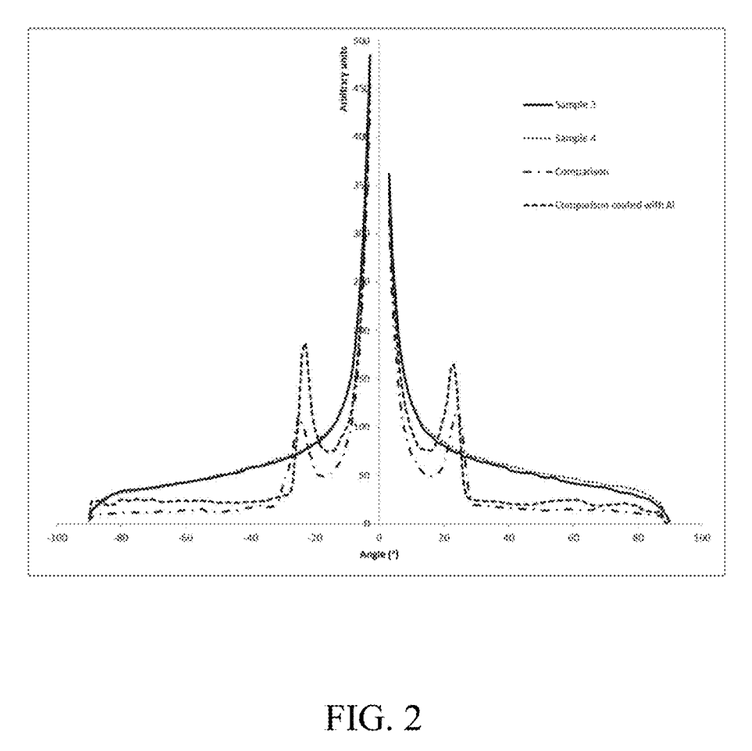
FIG. 2 includes a graphical illustration of reflectance measurements at 0° angle of illumination of exemplary embodiments and comparison samples.
Figure 3:
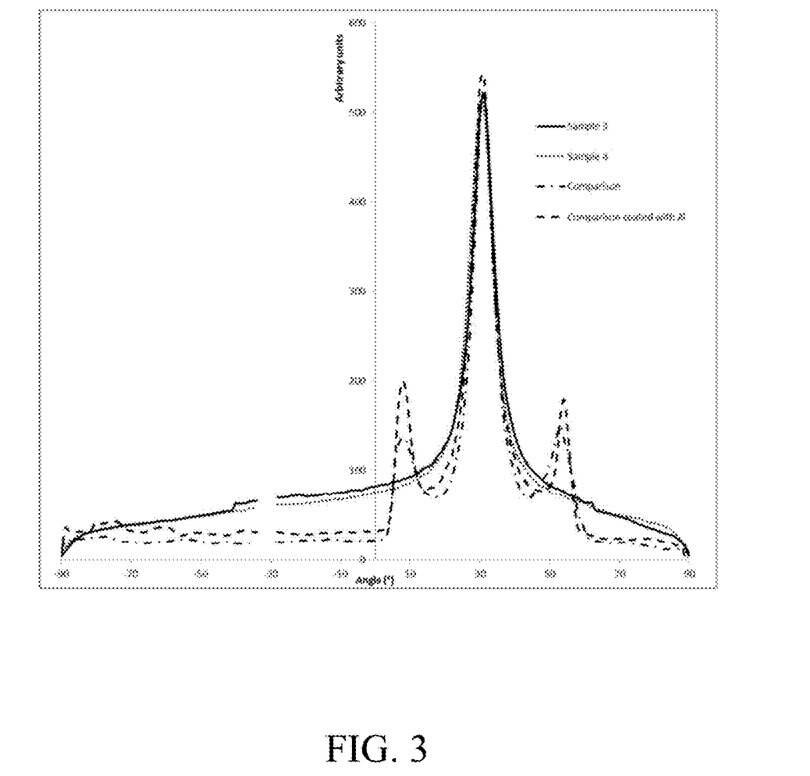
FIG. 3 includes a graphical illustration of reflectance measurements at −30° angle of illumination of exemplary embodiments and comparison samples.

Reflection measurements are taken with a Reflet Goniophotometer 90 instrument, herein referred to as a Goniometer, from 400 nm-900 nm with a fixed source at 0° directly illuminating the metallic side of each Sample, while the angle of the detector is changed and the angle of the sample is unchanged. Specifically, the scattered light is collected by moving the detector around the sample at various angles. Samples tested are Sample 3, Sample 4, Comparison sample (with the stainless steel coating) and the Comparison sample coated with aluminum (and without any stainless steel coating). Graphical results can be seen in FIGS. 2 and 3. For FIG. 2, all samples have 1 reflection peak that is greatest at the 0° angle of direct illumination. Both Comparison samples have three reflection peaks. Notably, Comparison sample and Comparison sample with aluminum coating provide a specular reflection with a reflectance peak at the 0° angle of direct illumination as well as two additional reflectance peaks, resulting in the view through their open mesh substrate being reduced only at certain viewing angles (i.e. at the angle of direction illumination and the two additional reflectance peaks). From angles of about −89° to about −30° and about 30° to about 89°, the reflectance values of the Comparison sample and Comparison sample with aluminum coating are much lower than Samples 3 and 4, which is an indication of less privacy for the Comparison sample and Comparison sample with aluminum coating. Clearly, with the higher and more uniform reflectance values (with one and only reflection peak at the angle of direct illumination), Samples 3 and 4 have a diffuse reflection profile (i.e. a greater privacy function across a wider range of angles) compared to the Comparison sample and Comparison sample with aluminum coating. The skilled artist will appreciate that even if the angle of the incident light source is changed, the specular reflection will be moved by the same angle in the opposite quadrant (i.e. light source at −30°, specular peak at 30° as seen in FIG. 3.) FIGS. 2 and 3 clearly show the unexpected differentiation of Samples 3 and 4 of improved and more diffuse reflection compared to the Comparison sample and Comparison sample with aluminum coating.

Figure 4:
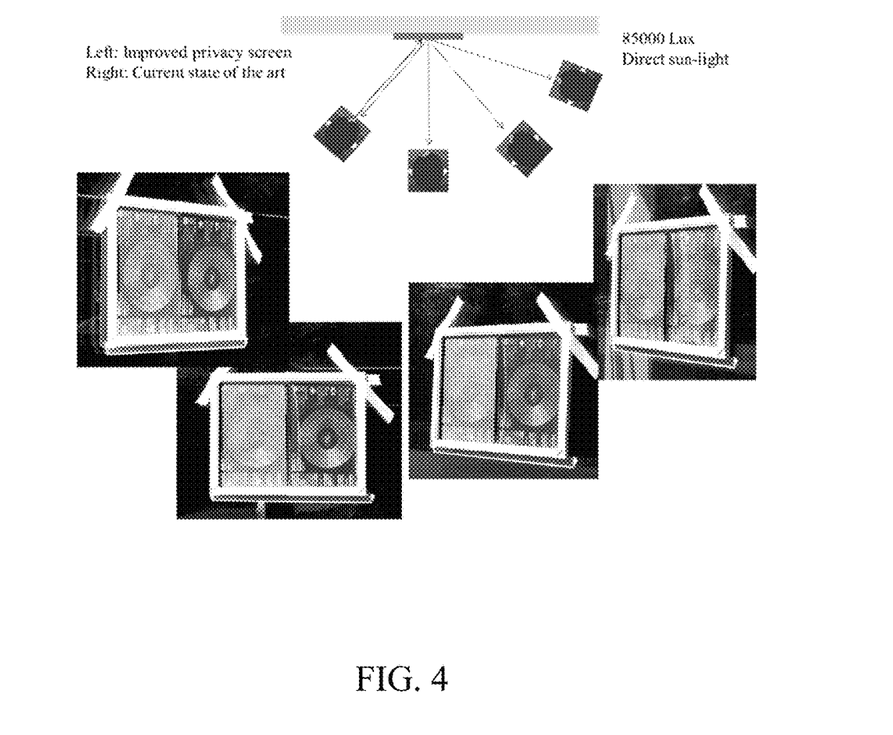
FIG. 4 includes a real-time picture of privacy effect as a function of view angle of an exemplary mesh screen and comparison sample in the presence of direct sunlight (85000 Lux).
Figure 5:
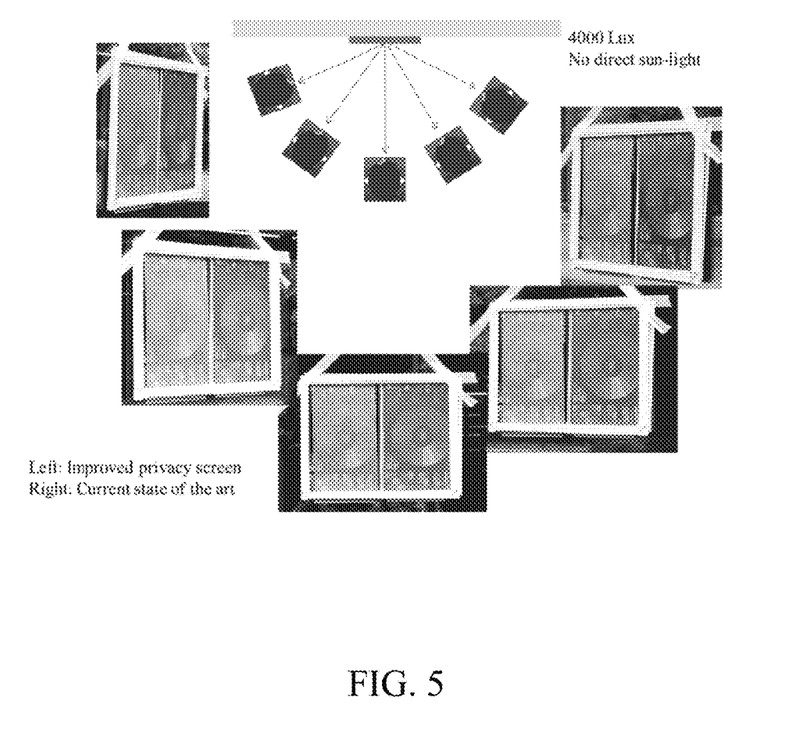
FIG. 5 includes a real-time picture of privacy effect as a function of viewing of an exemplary mesh screen and comparison sample with no direct sunlight (4000 Lux).

FIGS. 4 and 5 include a real-time picture of privacy effect as a function of view angle of Sample 2 and the Comparison sample. Sample 2 is on the left and the Comparison sample in on the right of FIGS. 4 and 5. Clearly, Sample 2 has improved privacy at all viewing angles compared to the Comparison sample in direct and without direct sunlight.

Figure 6:
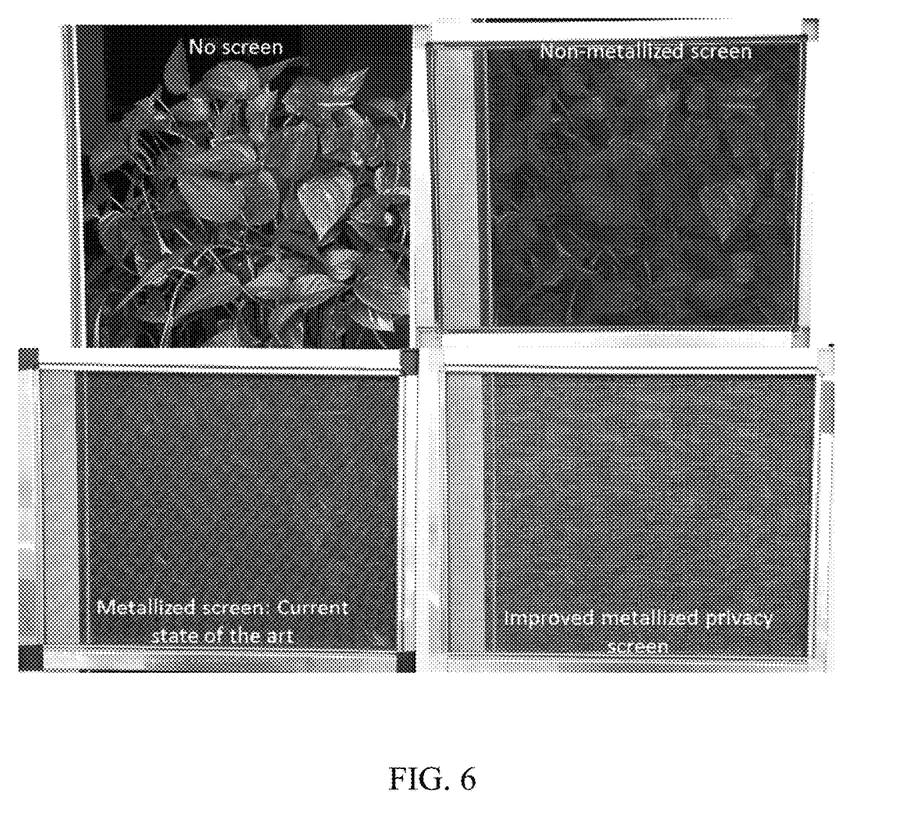
FIG. 6 includes a comparison of privacy functionality with three different mesh screens.

FIG. 6 shows comparison of privacy functionality. The non-metallized screen is coated with a black coating, the metallized screen: current state of the art is a stainless steel coated screen. An improved and exemplary metallized privacy screen is designed by optimizing the screen construction, yarn size, morphology of the yarn (i.e. ovality and surface roughness), with a stainless steel coating. The open mesh privacy screen unexpectedly provides a much improved extent of reduction in the view compared to the currently available commercial products.

Certain features, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A screen comprising:
    a mesh substrate, the mesh substrate having an openness of greater than 30% when viewed at 0° incidence, the mesh substrate having a first major surface and a second major surface, the first major surface comprising a first coating, the first major surface having a first reflectance value, wherein the first reflectance value has an average value of greater than about 10% as measured by an EN410 standard and a diffuse reflection profile at all viewing angles from −89° to 89° , excluding an angle of direct illumination as measured by a scattering distribution function technique using a Goniometer, wherein the diffuse reflection profile provides a reduction in view through the mesh substrate when viewed from −89° to 89°.

2. The screen of claim 1, wherein the second major surface has a second reflectance value, the second average reflectance value less than about 3% as measured by EN410 standard.

3. The screen of claim 1, wherein the first coating comprises a metal.

4. The screen of claim 3, wherein the metal comprises aluminum, iron, nickel, copper, zinc, titanium, gold, silver, chromium, platinum, steel, antimony, tin, an alloy of the metal, an oxide of the metal, or combination thereof.

5. The screen of claim 1, wherein the second major surface comprises a second coating comprising a polymer.

6. The screen of claim 1, wherein the mesh substrate comprises at least one first fiber oriented in a main direction of an open mesh substrate; and
    at least one second fiber oriented in a cross direction of the open mesh substrate, wherein the cross direction is different than the main direction, wherein the at least one first fiber and the at least one second fiber are configured to intersect.

7. The screen of claim 6, wherein the at least one first fiber and the at least one second fiber have a cross-section that is oval.

8. The screen of claim 7, wherein the at least one first fiber and the at least one second fiber have a cross-section that has an x-axis/y-axis value of greater than about 1.05.

9. The screen of claim 1, wherein the first major surface has an average surface roughness of greater than about 0.1μ.

10. A screen comprising:
at least one first fiber oriented in a main direction of a mesh substrate; and
at least one second fiber oriented in a cross direction of the mesh substrate, wherein the cross direction is different than the main direction, wherein the at least one first fiber and the at least one second fiber have a cross-section that is oval and wherein the at least one first fiber and the at least one second fiber are configured to intersect and provide an openness between the at least one first fiber and the at least one second fiber of greater than 30% when viewed at 0° incidence, the mesh substrate having a first major surface comprising a first coating, the first major surface having a first reflectance value, wherein the first reflectance value has an average value of greater than about 10% as measured by an EN410 standard and a diffuse reflection profile at all viewing angles from −89° to 89°, excluding an angle of direct illumination as measured by a scattering distribution function technique using a Goniometer, wherein the diffuse reflection profile provides a reduction in view through the mesh substrate when viewed from −89° to 89°.

* * * * *